United States Patent
Camuffo (10) Patent No.: US 12,149,382 B2
(45) Date of Patent: Nov. 19, 2024

(54) WIRELESS CIRCUITRY WITH NARROWBAND ERROR VECTOR MAGNITUDE (EVM) ESTIMATOR

(71) Applicant: Apple Inc., Cupertino, CA (US)

(72) Inventor: Andrea Camuffo, Munich (DE)

(73) Assignee: Apple Inc., Cupertino, CA (US)

( * ) Notice: Subject to any disclaimer, the term of this patent is extended or adjusted under 35 U.S.C. 154(b) by 167 days.

(21) Appl. No.: 17/876,916

(22) Filed: Jul. 29, 2022

(65) Prior Publication Data

US 2024/0039764 A1    Feb. 1, 2024

(51) Int. Cl.
*H04L 25/02* (2006.01)
*H03F 1/32* (2006.01)

(52) U.S. Cl.
CPC .......... *H04L 25/0204* (2013.01); *H03F 1/32* (2013.01); *H04L 25/0224* (2013.01)

(58) Field of Classification Search
CPC .... H04L 25/0204; H04L 25/0224; H03F 1/32
See application file for complete search history.

(56) References Cited

U.S. PATENT DOCUMENTS

| | | | | |
|---|---|---|---|---|
| 8,446,979 B1 * | 5/2013 | Yee | ........................ | H03F 1/3258 |
| | | | | 375/295 |
| 8,837,635 B2 * | 9/2014 | Lorenz | .................. | H03G 3/3042 |
| | | | | 375/295 |
| 8,908,751 B2 | 12/2014 | Camuffo et al. | | |
| 2006/0072656 A1 | 4/2006 | Wiss et al. | | |
| 2006/0276147 A1 * | 12/2006 | Suzuki | ................... | H03F 1/3258 |
| | | | | 455/114.3 |
| 2007/0026838 A1 * | 2/2007 | Staudinger | ................ | H03F 3/24 |
| | | | | 455/341 |
| 2009/0316589 A1 | 12/2009 | Shafeeu | | |
| 2012/0219048 A1 * | 8/2012 | Camuffo | ............... | H03F 1/3247 |
| | | | | 375/296 |
| 2012/0314746 A1 | 12/2012 | Lorenz et al. | | |
| 2014/0191799 A1 * | 7/2014 | Ohkawara | ................. | H03F 3/19 |
| | | | | 330/149 |
| 2020/0382147 A1 * | 12/2020 | Menkhoff | ............... | H03F 3/195 |

\* cited by examiner

*Primary Examiner* — David B Lugo
(74) *Attorney, Agent, or Firm* — Treyz Law Group, P.C.; Jason Tsai (57) ABSTRACT

Wireless circuitry can include a processor that generates a reference baseband signal, an upconversion circuit that upconverts the baseband signals to radio-frequency signals, an amplifier that amplifies the radio-frequency signals, and an antenna. The amplifier can be adjusted based on an estimated value computed using error vector magnitude (EVM) estimation circuitry. The EVM estimation circuitry may include a first filter configured to receive the reference signal, a second filter configured to receive a measured signal coupled from the output of the amplifier, a first signal extraction circuit coupled to an output of the first filter, a second signal extraction circuit coupled to an output of the second filter, and a comparison circuit having a first input that receives signals from the first signal extraction circuit, a second input that receives signals from the second signal extraction circuit, and an output on which the estimated value is provided.

19 Claims, 6 Drawing Sheets

WIRELESS CIRCUITRY WITH NARROWBAND ERROR VECTOR MAGNITUDE (EVM) ESTIMATOR

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals transmitted by an antenna can be fed through one or more power amplifiers, which are configured to amplify low power analog signals to higher power signals more suitable for transmission through the air over long distances. It can be challenging to determine an optimal supply voltage for a radio-frequency power amplifier.

SUMMARY

An electronic device may include wireless communications circuitry. The wireless communications circuitry can include one or more processors or signal processing blocks for generating baseband signals, a transceiver for receiving the digital signals and for generating corresponding radio-frequency signals, and one or more radio-frequency power amplifiers configured to amplify the radio-frequency signals for transmission by one or more antennas in the electronic device.

For baseband signals having signal bandwidths less than a bandwidth threshold, envelope tracking techniques can be used to continuously adjust the power supply voltage of the radio-frequency power amplifier. For baseband signals having signal bandwidths greater than the bandwidth threshold, a proper supply voltage could be set in order to have the best tradeoff between EVM and power consumption. An error vector magnitude (EVM) estimation circuitry can be used to compare a reference baseband signal output from the one or more processors and a measured signal coupled from the output of the radio-frequency power amplifier and to compute a figure of merit that is used to adjust the power supply voltage of the radio-frequency power amplifier.

An aspect of the disclosure provides EVM estimation circuitry that includes a first filter having an input configured to receive a reference signal, a second filter having an input configured to receive a measured signal that is a demodulated version of the radio-frequency signal generated at an output of a radio-frequency amplifier, a first signal extraction circuit coupled to an output of the first filter, a second signal extraction circuit coupled to an output of the second filter, and a comparison circuit having a first input coupled to an output of the first signal extraction circuit, a second input coupled to an output of the second signal extraction circuit, and an output on which an estimated value (figure of merit) is computed. The EVM estimation circuitry can include a first frequency shifting circuit coupled at the input of the first filter and a second frequency shifting circuit coupled at the input of the second filter. The EVM estimation circuitry can include a downconversion circuit having an input coupled to the output of the radio-frequency amplifier and an analog-to-digital converter having an input coupled to the downconversion circuit and having an output coupled to the input of the second filter. The first and second signal extraction circuits can be configured to extract amplitude signal components from the reference and measured signals.

The comparison circuit can include a subtraction circuit having a first input coupled to the output of the first signal extraction circuit and having a second input coupled to the output of the second signal extraction circuit, and can further include an energy measurement circuit that is coupled to an output of the subtraction circuit and that is configured to compute the estimated value. The energy measurement circuit can include a first subcircuit configured to perform a squaring function, a second subcircuit configured to perform an integrate function, and a third subcircuit configured to perform a doubling function. The comparison circuit can further include a first additional energy measurement circuit having an input coupled to the output of the first signal extraction circuit, a second additional energy measurement circuit having an input coupled to the output of the second signal extraction circuit, and a gain calculation circuit configured to receive signals from the first and second additional energy measurement circuit and to control a scaling circuit that is disposed at the first input of the subtraction circuit or at the second input of the subtraction circuit.

An aspect of the disclosure provides a method of operating wireless transmit circuitry. The method can include: filtering a reference signal from a processor, filtering a measured signal coupled from an output of a radio-frequency amplifier, extracting a first amplitude signal from the filtered reference signal, extracting a second amplitude signal from the filtered measured signal, computing an estimated value by obtaining a difference between the first amplitude signal and the second amplitude signal, and tuning one or more components in the wireless transmit circuitry based on the estimated value. The method can optionally include shifting a frequency of the reference signal prior to filtering the reference signal and shifting a frequency of the measured signal prior to filtering the measured signal. Computing the estimated value can include measuring a first energy level of the first amplitude signal, measuring a second energy level of the second amplitude signal, and scaling the first amplitude signal or the second amplitude signal based on the measured first and second energy level. Computing the estimated value can also involve squaring the difference to produce a squared result, integrating the squared result to produce an integrated value, and doubling the integrated value.

An aspect of the disclosure provides error vector magnitude estimation circuitry that includes a first low pass filter configured to receive a reference signal from one or more processors and to generate a first filtered signal, a second low pass filter configured to receive a demodulated feedback signal from a radio-frequency amplifier and to generate a first filtered signal, a first extraction circuit configured to extract an amplitude component from the first filtered signal to generate a first amplitude signal, a second extraction circuit configured to extract an amplitude component from the second filtered signal to generate a second amplitude signal, and a comparison circuit configured to compare the first and second amplitude signals to generate a figure of merit that is used to adjust a supply voltage for the radio-frequency amplifier. The comparison circuit can include a first energy measurement circuit configured to measure a first energy level of the first amplitude signal, a second energy measurement circuit configured to measure a second energy level of the second amplitude signal, a gain calculation circuit configured to compare the first and second energy levels and to scale the second amplitude signal to produce a scaled version of the second amplitude signal, and a subtraction circuit configured to compute a difference between the first amplitude signal and the scaled version of the second amplitude signal. The comparison circuit can further include a first subcircuit configured to square the difference output from the subtraction circuit, a second subcircuit configured to integrate signals output from the first subcircuit, and a third subcircuit configured to double the signals output from the second subcircuit to generate the figure of merit. The third subcircuit can also be implemented by an operation in firmware or in a processor.

DETAILED DESCRIPTION

Figure 1:
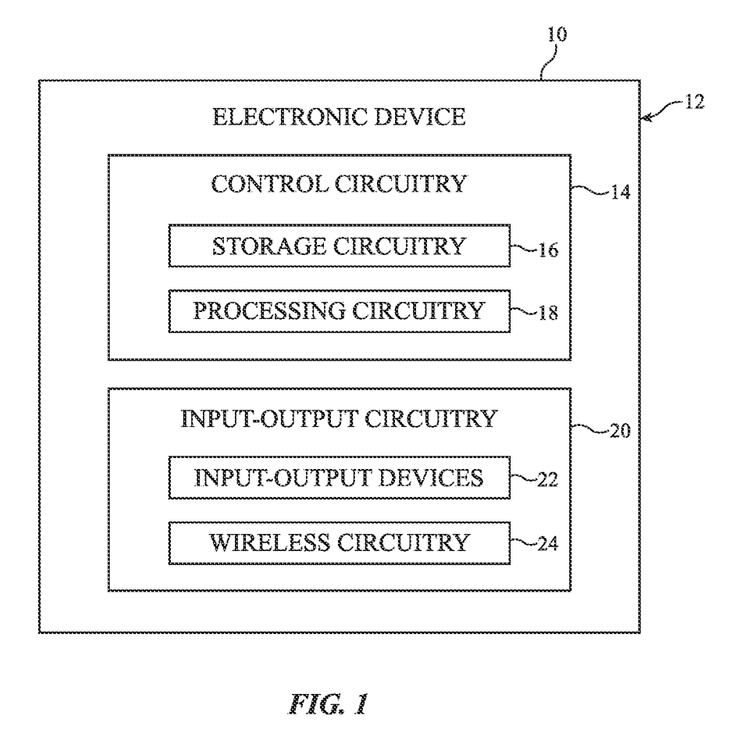
FIG. 1 is a diagram of an illustrative electronic device having wireless circuitry in accordance with some embodiments.

An electronic device such as device 10 of FIG. 1 may be provided with wireless circuitry. The wireless circuitry may include a processor for generating baseband signals, an upconversion circuit for upconverting (mixing) the baseband signals into radio-frequency signals, a radio-frequency amplifier for amplifying the radio-frequency signals, and an antenna for radiating the amplified radio-frequency signals.

The radio-frequency (RF) amplifier can receive a supply voltage that is continuously adjusted using envelope tracking circuitry such that the gain of the radio-frequency amplifier remains constant over varying signal amplitudes. This reduces the average current consumption of the radio-frequency amplifier. Such envelope tracking techniques are possible for baseband signals up to a certain bandwidth threshold. In certain applications where the baseband signals exceed the bandwidth threshold, envelope tracking techniques are no longer possible. Therefore, a semi-static supply voltage should be selected as low as possible to avoid excessive power consumption.

A narrowband error vector magnitude (EVM) estimator is provided that can calculate a figure of merit for baseband signals with large bandwidths exceeding the bandwidth threshold. The narrowband EVM estimator may include radio-frequency demodulators, digital filters for filtering the baseband signals and measurement signals fed back from the output of the RF amplifier, extraction circuits for isolating an amplitude or phase component from the filtered signals, and a comparison circuit for comparing signals output from the extraction circuits. The comparison circuit can calculate a figure of merit that is proportional to the EVM, which can be used to adjust one or more components in the transmit path to optimize for power efficiency.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
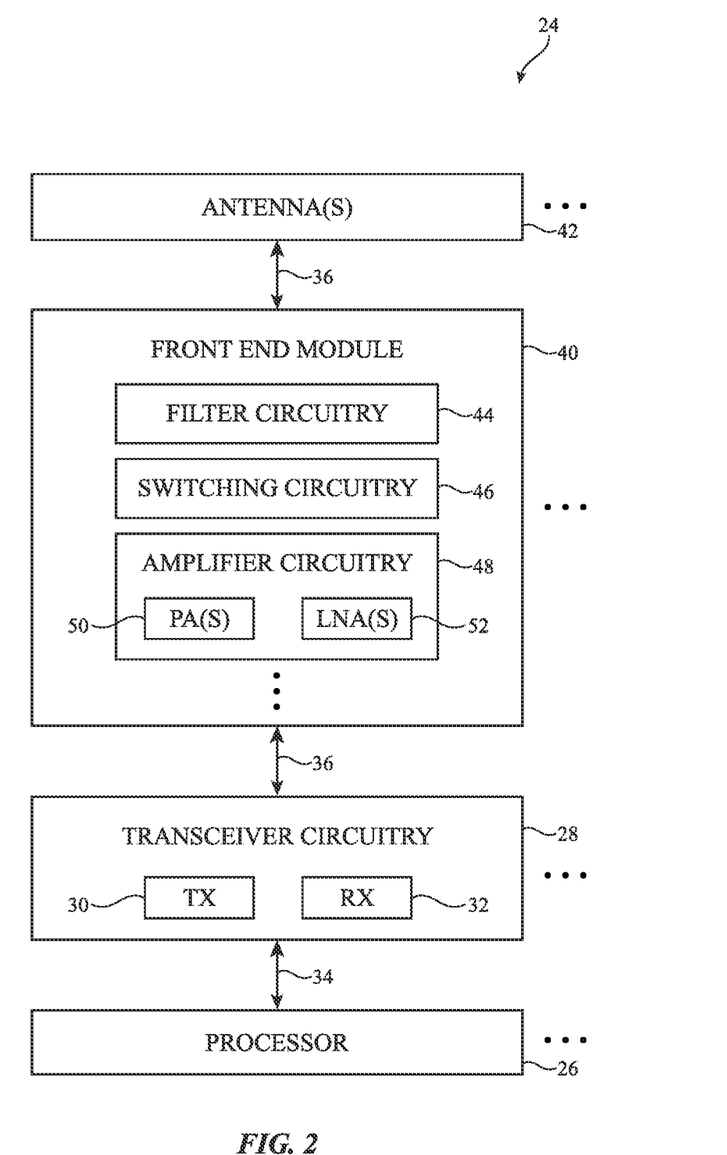
FIG. 2 is a diagram of illustrative wireless circuitry having amplifiers in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, application specific signal processing hardware, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 36, any desired number of front end modules and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 into corresponding radio-frequency signals. For example, transceiver circuitry 28 may include mixer circuitry for up-converting (or modulating) the transmit (baseband) signals to radio frequencies prior to transmission over antenna 42. The example of FIG. 2 in which processor 26 communicates with transceiver 28 is illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip. If desired, amplifier circuitry 48 and/or other components in front end 40 such as filter circuitry 44 may also be implemented as part of transceiver circuitry 28.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLO-NASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

As described above, front end module 40 may include one or more power amplifiers (PA) circuits 50 in the transmit (uplink) path. A power amplifier 50 (sometimes referred to as radio-frequency power amplifier, transmit amplifier, or amplifier) may be configured to amplify a radio-frequency signal without changing the signal shape, format, or modulation. Amplifier 50 may, for example, be used to provide 10 dB of gain, 20 dB of gain, 10-20 dB of gain, less than 20 dB of gain, more than 20 dB of gain, or other suitable amounts of gain.

It can be challenging to design a satisfactory radio-frequency power amplifier for an electronic device. In general, a radio-frequency amplifier is most efficient when it is operating in compression (i.e., when an increase in the input power results in a non-linear change in output power of the amplifier, which typically occurs at the higher range of input power levels). Conventional radio-frequency power amplifiers that receive a fixed power supply voltage will become less efficient when the amplifier operates at lower input power levels.

In an effort to address this reduction in efficiency, an envelope tracking technique has been developed where the power supply voltage of the radio-frequency power amplifier is continuously adjusted such that the gain of the power amplifier remains constant over varying signal amplitudes (sometimes referred to as iso-gain operation). Other gain shaping strategies such as iso-compression operation, pre-defined gain-over-power characteristic, etc. are possible as well. A conventional implementation of the envelope tracking system generates a variable power supply voltage using a static linear transformation of the absolute value of a baseband signal from which the radio-frequency signals are generated.

Figure 3:
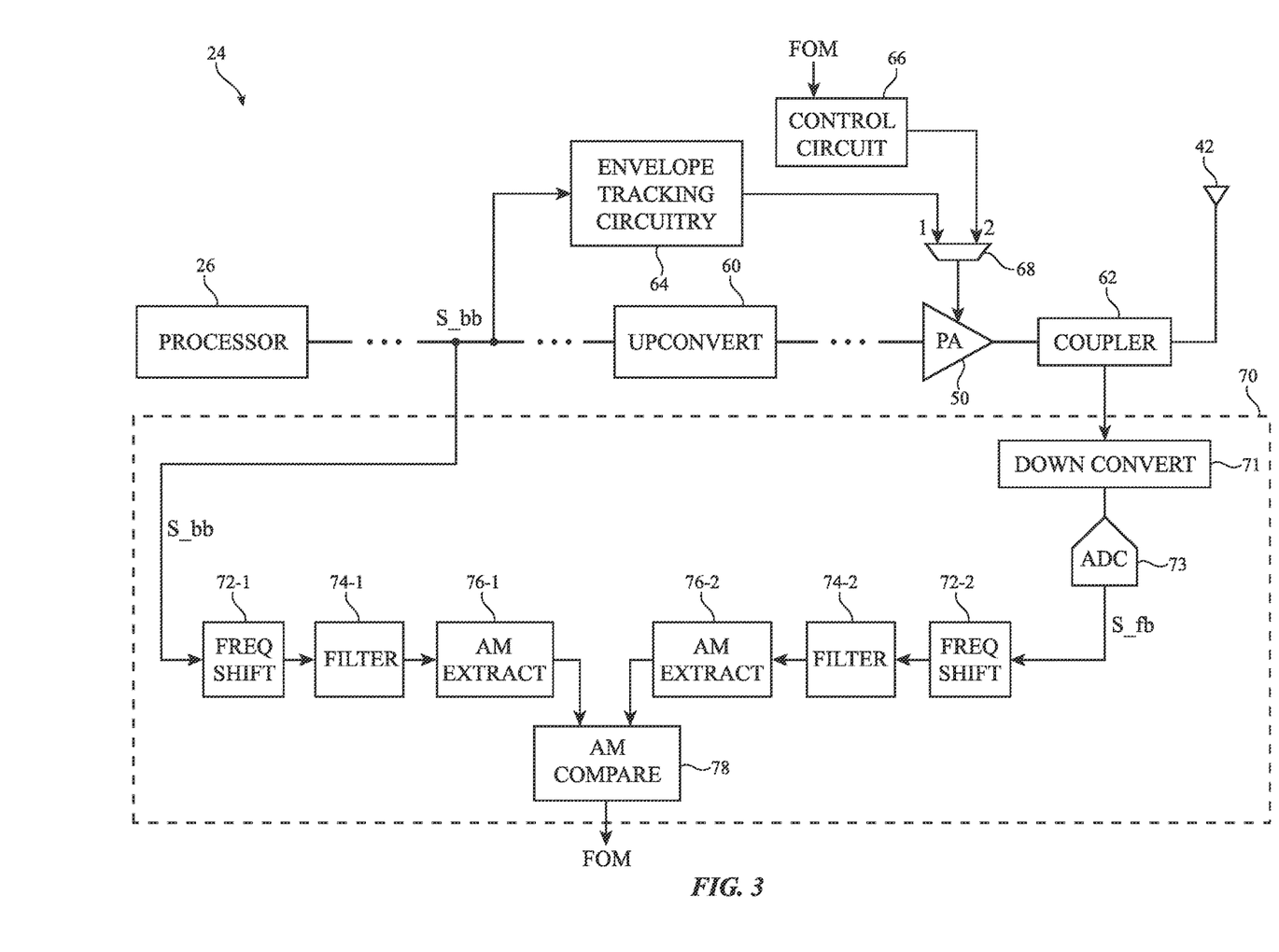
FIG. 3 is a diagram of illustrative wireless circuitry having envelope tracking circuitry and narrowband error vector magnitude (EVM) estimation circuitry in accordance with some embodiments.

FIG. 3 is a diagram of illustrative wireless circuitry having circuitry for adjusting radio-frequency power amplifier 50. As shown in FIG. 3, wireless circuitry 24 may include processor 26 configured to generate baseband signals, an upconversion circuit such as upconverter 60, a radio-frequency power amplifier such as amplifier 50, and an antenna 42 configured to radiate radio-frequency signals output from amplifier 50. Processor 26 may represent one or more processors such as a baseband processor, an application processor, a digital signal processor, a microcontroller, a microprocessor, a central processing unit (CPU), a programmable device, a combination of these circuits, and/or one or more processors within circuitry 18. Processor 26 may be configured to generated digital (baseband) signals S_bb. Signals S_bb are sometimes referred to as baseband signals, digital signals, or transmit signals. As examples, the digital signals generated by processor 26 may include in-phase (I) and quadrature-phase (Q) signals, radius and phase signals, or other digitally-coded signals. The baseband signals S_bb may at some point be converted from the digital domain into the analog domain using one or more digital-to-analog converters and then upconverted (modulated) to radio frequencies, using upconverter 60 (e.g., a radio-frequency mixer), from the baseband frequency range (which is typically in the range of a couple hundred to a couple hundred MHz) to radio frequencies in the range of hundreds of MHz or in the GHz range. Upconverter 60 is sometimes referred to as a radio-frequency modulator.

The upconverted radio-frequency signals may be fed as an input to amplifier 50. Amplifier 50 may generate corresponding amplified radio-frequency signals that can then be radiated by antenna(s) 42. Wireless circuitry may include an envelope tracking (ET) system such as envelope tracking circuitry 64 configured to continuously adjust a supply voltage of amplifier 50 to ensure that amplifier 50 is always operating at peak efficiency. In practice, however, envelope tracking circuitry 64 is only effective for baseband signals up to a certain bandwidth threshold (e.g., envelope tracking techniques might only be effective when the bandwidth of the baseband signals is less than 100 MHz). In scenarios where the bandwidth of the baseband signals is greater than the bandwidth threshold (e.g., when the bandwidth of S_bb is greater than 100 MHz, greater than 50 MHz, 50-100 MHz, 100-200 MHz, greater than 150 MHz, greater than 200 MHz, greater than 300 MHz, etc.), the efficacy of envelope tracking circuitry 64 is limited or can introduce unacceptable distortion. Therefore, it may be necessary to operate the radio-frequency power amplifier with a semi-static supply voltage as a function of symbol power and/or modulation schema. To ensure that this semi-static supply voltage is not too low, some margin is needed to cope with environmental conditions.

In accordance with an embodiment, wireless circuitry 24 may be provided with performance estimation circuitry such as performance estimation circuitry 70 that is configured to calculate a performance metric that can be used to control amplifier 50 when the bandwidth of the baseband signals is greater than the bandwidth threshold (e.g., when signal S_bb is a wideband signal having a bandwidth that is more than 50 MHz, more than 100 MHz, more than 150 MHz, at least 200 MHz, at least 250 MHz, at least 300 MHz, etc.). Estimation circuitry 70 may have a first input port configured to receive digital baseband signal S_bb output from processor 26, a second input port configured to receive a demodulated measurement signal fed back from the output of amplifier 50 via a radio-frequency coupler 62, and an output port on which a figure of merit FOM is generated. The baseband signal S_bb received at the first input port of estimation circuitry 70 is sometimes referred to herein as a reference signal, whereas the measurement signal received at the second input port of estimation circuitry 70 is sometimes referred to herein as a feedback signal since the measurement signal is fed back from the output of amplifier 50. The reference signal received at the first input port of estimation circuitry 70 and the measurement (feedback) signal received at the second input portion of estimation circuitry 70 can include both in-phase (I) signal components and quadrature (Q) signal components and can therefore be referred to as a reference IQ signal and a measured (feedback) IQ signal. The reference and measured IQ signals may be complex signals.

Coupler 62 may represent any radio-frequency coupling circuit that is coupled between amplifier 50 and antenna 42 and that is configured to sense the signal at the output of amplifier 50. The figure of merit FOM calculated and output by estimation circuitry 70 may be equal to or may serve as a proxy for a signal to noise ratio (SNR) or error vector magnitude (EVM) of the overall transmit chain (path), which can include all of the electronic components between processor 26 and radio-frequency coupler 62, including the performance of amplifier 50. Error vector magnitude is the normalized length of an error vector from the reference IQ signal to the measured IQ signal. Performance measurement circuitry 70 is therefore sometimes referred to as EVM estimation circuitry or an EVM estimation system. Figure of merit FOM that is output from EVM estimation circuitry 70 can be referred to as an estimated value, a performance metric, an error metric, a noise metric, or an SNR metric.

The first input port of EVM estimation circuitry 70 may be coupled to a first optional frequency shifting circuit such as frequency shifter 72-1, a first filter circuit such as low pass filter 74-1, and a first signal component extraction circuit such as amplitude extractor 76-1. Frequency shifter 72-1 can be used to shift the reference signal to a different center frequency prior to being filtered by filter 74-1. Filter 74-1 can be used to filter the reference signal to produce the narrowband reference signal. Filter 74-1 can have a relatively low single-sideband cutoff frequency of 2 MHz, less than 3 MHz, less than 4 MHz, 1-3 MHz, 2-4 MHz, less than 5 MHz, less than 10 MHz, etc.

The second input port of EVM estimation circuitry 70 may be coupled to a downconverting circuit such as downconverter 71, a data converter such as an analog-to-digital converter (ADC) 73, a second optional frequency shifting circuit such as frequency shifter 72-2, a second filter circuit such as low pass filter 74-2, and a second signal component extraction circuit such as amplitude extractor 76-2. Downconverter 71 can be used to down-convert (mix) the measured signal from radio frequencies down to baseband frequencies and is sometimes referred to as a radio-frequency demodulator. Analog-to-digital converter 73 can be used to convert the downconverted measured signal from the analog domain to the digital domain to output measured (feedback) signal S_fb. Signal S_fb is therefore sometimes referred to herein as a demodulated signal, a demodulated measured signal, or a demodulated feedback signal.

Frequency shifter 72-2 can be used to shift the measured signal S_fb to a different center frequency prior to being filtered by filter 74-2. Filter 74-2 can be used to filter measured signal S_fb. Filter 74-2 can have a relatively low cutoff frequency of 2 MHz, less than 3 MHz, less than 4 MHz, 1-3 MHz, 2-4 MHz, less than 5 MHz, less than 10 MHz, etc. Filters 74-1 and 74-2 should have identical structures (e.g., filters 74-1 and 74-2 are digital filters having the same filter topology, the same filter order, the same filter coefficients, the same clock frequency, etc.). This ensures that the processing of the reference signal and the measured signal is as similar as possible so that the subsequent comparison is accurate and consistent. The circuit components in the feedback/measurement path (e.g., including components 62, 71, 73, 72-2, 74-2, and 76-2) can collectively be referred to as being part of feedback receiver circuitry.

In general, the error vector magnitude is proportional to the distortion introduced by non-linearities along the transmit chain (e.g., the amount of intermodulation products falling in-band). Without any filtering, the total amount of distortion is correlated with the main baseband signal. The use of filters 74-1 and 74-2 isolates only a small portion of the original spectrum of the baseband signal such that the bandwidth of the slice of spectrum being isolated is in a much smaller range of 4-10 MHz, 2-20 MHz, less than 5 MHz, less than 10 MHz, less than 20 MHz, less than 30 MHz, or other range. The bandwidth of the filtered signal can thus be less than 10 times the bandwidth of the original (unfiltered) baseband signal, less than 20 times the bandwidth of the original (unfiltered) baseband signal, less than 10-20 times the bandwidth of the original (unfiltered) baseband signal, less than 30 times the bandwidth of the original (unfiltered) baseband signal, less than 40 times the bandwidth of the original (unfiltered) baseband signal, less than 50 times the bandwidth of the original (unfiltered) baseband signal, less than 20-50 times the bandwidth of the original (unfiltered) baseband signal, less than 50-100 times the bandwidth of the original (unfiltered) baseband signal, or less than 100 times the bandwidth of the original (unfiltered) baseband signal.

Figure 5:
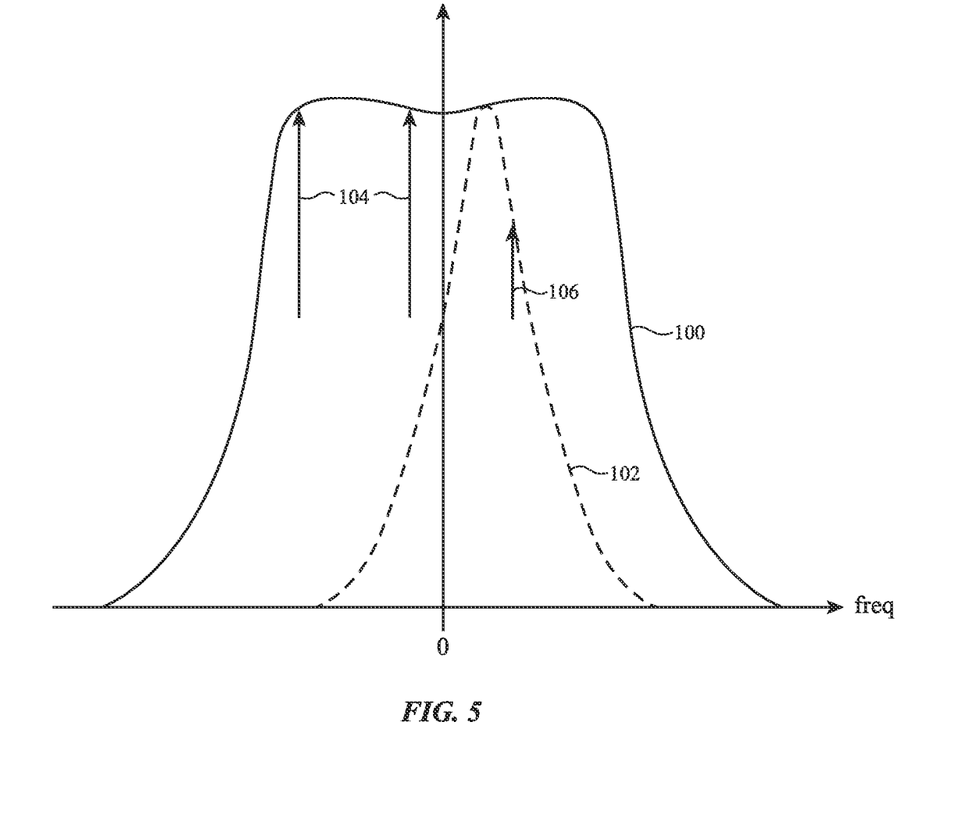
FIG. 5 is a diagram illustrating why the energy of distortion components captured by a narrowband filter is not correlated with the resulting filtered signal in accordance with some embodiments.

FIG. 5 is a diagram illustrating why the energy of distortion components captured by a narrowband filter is not correlated with resulting the filtered signal. Curve 100 represents the original ideal baseband signal. Curve 102 represents a narrowband filter having a bandwidth much smaller than the bandwidth of curve 100 (e.g., 10× smaller bandwidth, 5× smaller bandwidth, 5-10× smaller bandwidth, 20× smaller bandwidth, 10-20× smaller bandwidth, etc.). As shown in FIG. 5, intermodulation products such as product 106 falling within the narrowband filter is caused by signal components such as tones 104 falling outside the filter bandwidth. Thus, most of the energy of the distortion within the filtered portion is not correlated with the filtered signal itself (e.g., more than 95% of the energy of the distortion within the filtered portioned is not correlated with the filtered signal itself).

The target figure of merit should reflect the SNR of the transmit chain. Both the amplitude and phase of the filtered signal contribute to the overall noise level. Since the noise/distortion is uncorrelated with the main filtered signal, the noise energy of the amplitude component must match the noise energy of the phase component. Since the amplitude and phase contributions are equal, measuring the noise of the amplitude component is sufficient. This recognition that the distortion energy is uncorrelated with the ideal filtered signal therefore allows skipping or omission of a separate dedicated phase measurement (e.g., the phase noise contribution need not be evaluated). The use of digital low pass filters for filters 74-1 and 74-2 is illustrative. If desired, filters 74-1 and 74-2 can also be bandpass filters having a narrow filter bandwidth of 2-20 MHz, less than 5 MHz, less than 10 MHz, less than 20 MHz, less than 30 MHz, or other range. Thus, EVM estimation circuitry 70 can sometimes be referred to as narrowband EVM estimation circuitry. Isolating only a small portion of the original signal spectrum using filters 72-1 and 72-2 can provide one or more technical benefits, including allowing the group delay within each slice of the spectrum to be neglected, allowing the alignment requirement to be significantly relaxed, and allowing the sampling rate of the feedback receiver to be reduced.

Referring back to FIG. 3, the filtered reference signal output from filter 74-1 can be fed to first amplitude extraction circuit 76-1 for extracting only the amplitude component (without extracting any phase component) from the filtered reference signal. Similarly, the filtered measured signal output from filter 74-2 can be fed to second amplitude extraction circuit 76-2 for extracting only the amplitude component (without extracting any phase component) from the filtered measurement signal. Amplitude extraction circuits 76-1 and 76-2 may obtain the amplitude signal by, for example, computing a square root of the sum of the square of the in-phase signals and the square of the quadrature signals. The resulting amplitude components of the reference signal and the measured signal can then be compared at amplitude comparison circuit 78 to calculate figure of merit FOM.

This computed FOM can be fed to a control circuit such as controller 66. Controller 66 can compare the FOM to a predetermined target level (value). For example, if the FOM is below the target level, then control circuit 66 may lower the supply voltage of amplifier 50 to avoid wasting energy. Controller 66 may continue to lower the supply voltage of amplifier 50 until the FOM is equal to the target level to optimize for transmit power efficiency. A switching circuit such as multiplexer 68 may be used to switch between a first amplifier control mode and a second amplifier control mode. The first amplifier control mode can be used when the bandwidth of the baseband signal is less 100 MHz (as an example), which allows envelope tracking circuitry 64 to adjust the supply voltage of amplifier 50. The second amplifier control mode can be used when the bandwidth of the baseband signal is more than 100 MHz or other threshold, which allows controller 66 to adjust the supply voltage of amplifier 50 based on the FOM calculated by EVM estimation circuitry 70.

Figure 4:
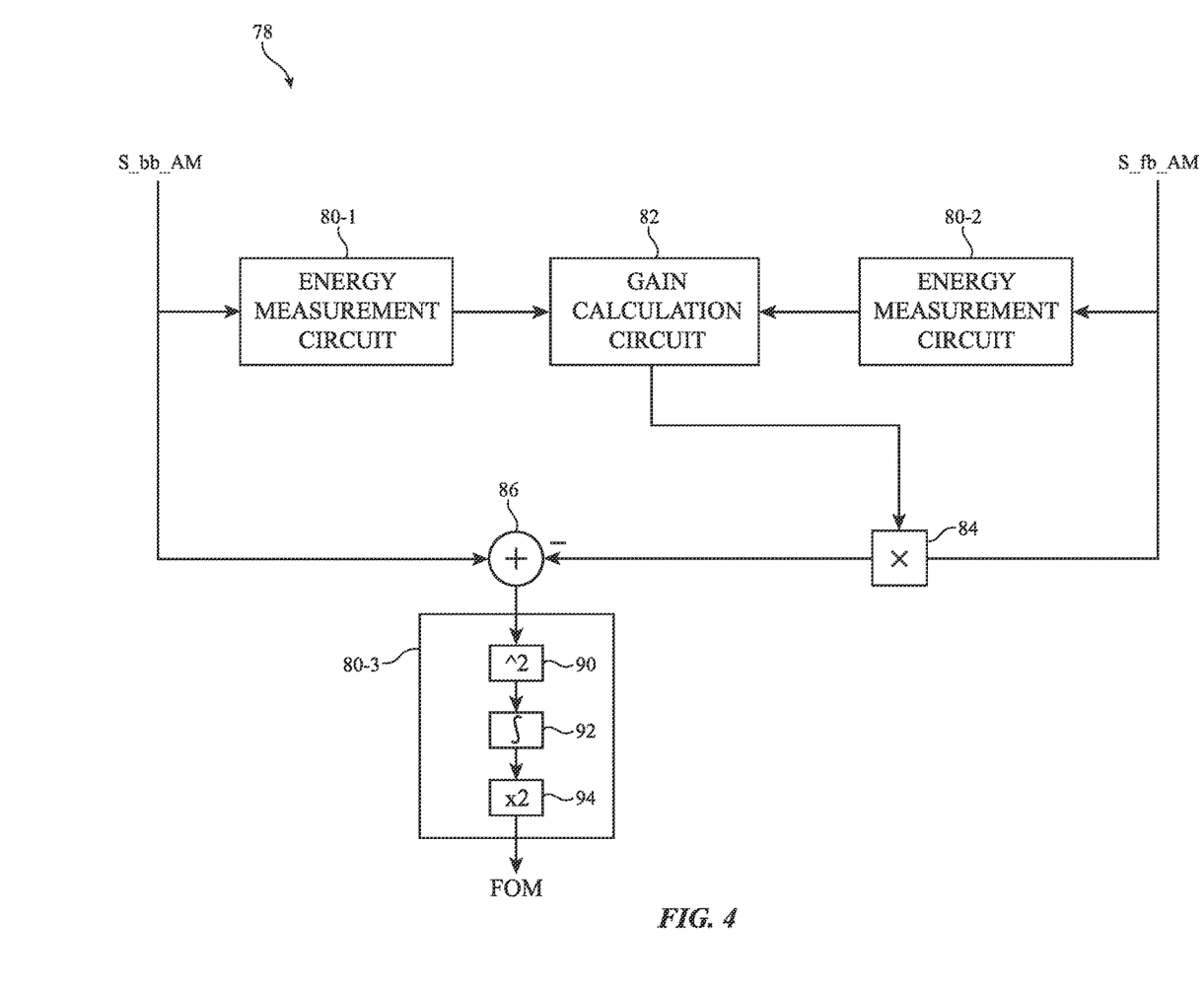
FIG. 4 is a diagram of an illustrative comparison circuit that can be included within the narrowband EVM estimation circuitry shown in FIG. 3 in accordance with some embodiments.

FIG. 4 is a diagram of an illustrative comparison circuit 78 that can be included within EVM estimation circuitry 70 of the type shown in FIG. 3. As shown in FIG. 4, comparison circuit 78 can include a first input port configured to receive an amplitude signal S_bb_AM output from first amplitude extraction circuit 76-1, a second input port configured to receive an amplitude signal S_fb_AM output from second amplitude extraction circuit 76-2, and an output on which figure of merit FOM is generated. Comparison circuit 78 may include energy measurement circuits 80-1, 80-2, and 80-3, a gain calculation circuit 82, a signal scaling circuit 84, and a subtraction circuit 86.

First energy measurement circuit 80-1 may compute an energy level of signal S_bb_AM (e.g., to estimate an energy level of the amplitude of the filtered reference signal), whereas second energy measurement circuit 80-2 may compute an energy level of signal S_fb_AM (e.g., to estimate an energy level of the amplitude of the filtered measurement/feedback signal). Energy measurement circuits 80-1 and 80-2 can, for example, estimate the energy level of the filtered signals by squaring the received amplitude signal and then integrating the squared result. This is illustrative. If desired, other energy or power estimation methods can be employed.

Gain calculation circuit 82 may receive the energy levels output from energy measurement circuits 80-1 and 80-2 and compute a gain adjustment value for controlling scaling circuit 84. Gain calculation circuit 82 may direct scaling circuit 84 to provide signal amplification or signal attenuation depending on the relative energy levels of the reference signal path and the measured signal path. If the measured energy level from the reference path (e.g., from signal S_bb_AM) is greater than the measured energy level from the feedback path (e.g., from signal S_fb_AM), then gain calculation circuit 82 may direct scaler 84 to amplify signal S_fb_AM. If the measured energy level from the reference path (e.g., from signal S_bb_AM) is less than the measured energy level from the feedback path (e.g., from signal S_fb_AM), then gain calculation circuit 82 may direct scaler 84 to attenuate signal S_fb_AM. Configured and operated in this way, the gain of the amplitude signals in the reference path and the feedback path can be aligned (matched or normalized) prior to being subtracted at circuit 86.

The example of FIG. 4 in which scaling circuit 84 is disposed in the feedback path is illustrative. In another embodiment, scaling circuit 84 can instead be disposed in the reference path between the first input port of circuit 78 and subtraction circuit 86. Arranged in this way, the scaling circuit 84 can directly amplify or attenuate signal S_bb_AM to help align or match (normalize) the gain of signal S_fb_AM from the feedback path prior to being subtracted at circuit 86.

Subtraction circuit 86 may have a first input configured to receive signal S_bb_AM from the first input port of comparison circuit 78, a second input configured to receive an amplified or attenuated version of signal S_fb_AM via scaling circuit 84, and an output on which a difference of the two input signals is computed. Third energy measurement circuit 80-3 may include a first subcircuit 90 for computing the square of the computed difference value output from subtractor 86, a second subcircuit 92 for integrating the squared value output from subcircuit 90, and a third subcircuit 94 for doubling the integrated value output from subcircuit 92. The doubling operation at third subcircuit 94 can help account for the phase component, which should be equal to the amplitude component as described above in connection with FIG. 5. The value output from third subcircuit 94 may be equal to the estimated figure of merit FOM. The third subcircuit 94 can also be implemented by an operation in firmware or in a processor (e.g., in one or more processors in circuitry 18). The example of FIG. 4 in which energy measurement circuit 80-3 includes three signal processing subcircuits is illustrative. If desired, energy measurement circuit 80-3 can include more than three or less than three signal processing subcircuits for calculating FOM.

Figure 6:
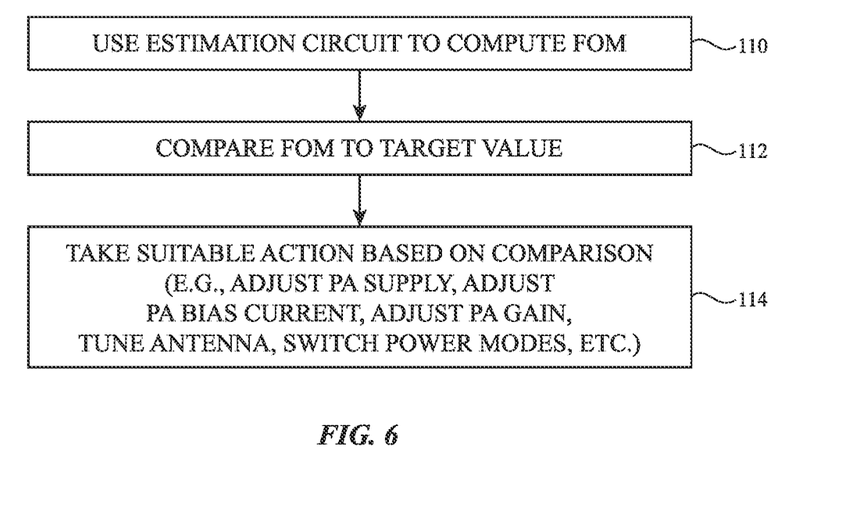
FIG. 6 is a flow chart of illustrative operations for using narrowband EVM estimation circuitry of the type shown in FIG. 3 to adjust one or more parameters of transmit circuitry in accordance with some embodiments.

FIG. 6 is a flow chart of illustrative operations for using EVM estimation circuitry 70 of the type shown in FIG. 3 to adjust one or more parameters of the transmit circuitry. During the operations of block 110, the EVM estimation circuitry can be used to compute a figure of merit. For example, the EVM estimation circuitry can include optional frequency shifters for shifting the frequency of a reference signal output from a baseband processor and for shifting the frequency of a measured signal fed back from an output of a radio-frequency power amplifier, digital filters for separately filtering the reference signal and the measured signal, extraction circuits for separately extracting the amplitude component from the filtered reference signal and the filtered measured signal, and a comparison circuit for computing a difference (error) between the extracted amplitude components of the filtered and measured signals. The computed difference can be used to calculate the figure of merit. The figure of merit may serve as a proxy for the error vector magnitude (EVM), signal-to-noise ratio (SNR), bit error rate (BER), or other performance metric associated with the wireless transmit circuitry.

During the operations of block 112, a control circuit (see, e.g., controller 66 in FIG. 3) can be used to compare the figure of merit with a target value. For example, the figure of merit can be compared with an EVM target to determine an amount of deviation from the currently measured EVM to the target EVM. As another example, the figure of merit can be compared with an SNR target to determine an amount of deviation from the currently measured SNR to the target SNR. As another example, the figure of merit can be compared with a bit error rate (BER) target to determine an amount of deviation from the currently measured BER to the target BER. In general, the figure of merit can be compared with any performance metric target to determine an amount of deviation from the currently measured performance metric to the target performance metric.

During the operations of block 114, the control circuit can take suitable action based on the comparison result from block 112. In the example of FIG. 3, control circuit 66 can adjust the positive power supply voltage of amplifier 50 until the measured figure of merit is equal to the target value. As another example, the control circuit can adjust one or more bias currents in amplifier 50 until the measured figure of merit is equal to the target value. As another example, the control circuit can adjust the gain of amplifier 50 until the measured figure of merit is equal to the target value. As another example, the control circuit can adjust one or more tuning elements associated with the antenna(s) until the measured figure of merit is equal to the target value. As another example, the control circuit can switch power modes (e.g., between low, high, and intermediate power modes) until the measured figure of merit is equal to the target value. In general, the control circuit can be used to adjust any one or more components in the transmit chain based on the computed figure or merit to optimize for efficiency.

The methods and operations described above in connection with FIGS. 1-6 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is exemplary and various modifications can be made to the described embodiments. The foregoing embodiments may be implemented individually or in any combination.

What is claimed is:

1. Circuitry comprising:
   a first filter configured to receive a reference signal;
   a second filter configured to receive a demodulated signal from an output of a radio-frequency amplifier;
   a first signal extraction circuit coupled to an output of the first filter;
   a second signal extraction circuit coupled to an output of the second filter;
   a comparison circuit having a first input coupled to an output of the first signal extraction circuit, a second input coupled to an output of the second signal extraction circuit, and an output on which an estimated value is computed, the estimated value being used to adjust the radio-frequency amplifier;
   a multiplexer having an output coupled to the radio-frequency amplifier;
   a control circuit coupled to a first input of the multiplexer and configured to receive the estimated value; and
   envelope tracking circuitry coupled to a second input of the multiplexer and configured to receive the reference signal.

2. The circuitry of claim 1, further comprising:
   a first frequency shifting circuit coupled at an input of the first filter; and
   a second frequency shifting circuit coupled at an input of the second filter.

3. The circuitry of claim 1, further comprising:
   a radio-frequency coupler coupled between the output of the radio-frequency amplifier and one or more antennas;
   a downconversion circuit having an input coupled to the radio-frequency coupler; and
   an analog-to-digital converter having an input coupled to the downconversion circuit and having an output coupled to an input of the second filter.

4. The circuitry of claim 1, wherein the first and second filters comprise digital low-pass filters that are identical in structure.

5. The circuitry of claim 1, wherein the first and second filters comprise low-pass or bandpass filters having a filter bandwidth less than 20 MHz.

6. The circuitry of claim 1, wherein the first signal extraction circuit is configured to extract an amplitude signal component from the reference signal and wherein the second signal extraction circuit is configured to extract an amplitude signal component from the demodulated signal.

7. The circuitry of claim 1, wherein the comparison circuit comprises:
   a subtraction circuit having a first input coupled to the output of the first signal extraction circuit and having a second input coupled to the output of the second signal extraction circuit; and
   an energy measurement circuit coupled to an output of the subtraction circuit and configured to compute the estimated value.

8. The circuitry of claim 7, wherein the energy measurement circuit comprises a first subcircuit configured to perform a squaring function, a second subcircuit configured to perform an integrate function, and a third subcircuit configured to perform a doubling function.

9. The circuitry of claim 7, wherein the comparison circuit further comprises:
   a first additional energy measurement circuit having an input coupled to the output of the first signal extraction circuit;
   a second additional energy measurement circuit having an input coupled to the output of the second signal extraction circuit; and
   a gain calculation circuit configured to receive signals from the first and second additional energy measurement circuit and to control a scaling circuit that is disposed at the first input of the subtraction circuit or at the second input of the subtraction circuit.

10. A method of operating wireless transmit circuitry comprising:
    filtering a reference signal from a processor;
    filtering a demodulated signal coupled from an output of a radio-frequency amplifier;
    extracting a first amplitude signal from the filtered reference signal;
    extracting a second amplitude signal from the filtered demodulated signal;
    computing an estimated value by obtaining a first measurement on the first amplitude signal, obtaining a second measurement on the second amplitude signal, and scaling the first amplitude signal or the second amplitude signal based on the first and second measurements; and
    tuning one or more components in the wireless transmit circuitry based on the estimated value.

11. The method of claim 10, further comprising:
prior to filtering the reference signal, shifting a frequency of the reference signal; and
prior to filtering the demodulated signal, shifting a frequency of the demodulated signal.

12. The method of claim 10, further comprising:
downconverting a radio-frequency signal coupled from the output of the radio-frequency amplifier from a radio frequency to a baseband frequency; and
converting the downconverted signal from an analog domain to a digital domain to produce the demodulated signal.

13. The method of claim 10, wherein the first measurement comprises a first energy level measurement of the first amplitude signal, and wherein the second measurement comprises a second energy level measurement of the second amplitude signal.

14. The method of claim 10, wherein computing the estimated value comprises:
obtaining a difference between the first amplitude signal and the second amplitude signal;
squaring the difference to produce a squared result;
integrating the squared result to produce an integrated value; and
doubling the integrated value.

15. The method of claim 10, tuning one or more components in the wireless transmit circuitry based on the estimated value comprises:
comparing the estimated value to a target value; and
subsequent to comparing the estimated value to the target value, adjusting a power supply voltage of the radio-frequency amplifier.

16. Error vector magnitude estimation circuitry comprising:
a first low pass filter configured to receive a reference signal from one or more processors and to generate a first filtered signal;
a second low pass filter configured to receive a demodulated feedback signal from a radio-frequency amplifier and to generate a second filtered signal;
a first extraction circuit configured to extract an amplitude component from the first filtered signal to generate a first amplitude signal;
a second extraction circuit configured to extract an amplitude component from the second filtered signal to generate a second amplitude signal; and
a comparison circuit configured to compare the first and second amplitude signals to generate a figure of merit that is used to adjust a supply voltage for the radio-frequency amplifier, wherein the comparison circuit comprises a first energy measurement circuit configured to measure a first energy level of the first amplitude signal a second energy measurement circuit configured to measure a second energy level of the second amplitude signal, and a gain calculation circuit configured to compare the first and second energy levels and to scale the second amplitude signal to produce a scaled version of the second amplitude signal.

17. The error vector magnitude estimation circuitry of claim 16, further comprising:
a downconverter configured to downconvert a radio-frequency signal generated from the radio-frequency amplifier from a radio frequency to a baseband frequency;
a data converter configured to convert the feedback signal from an analog signal to a digital signal; and
a frequency shifting circuit coupled between the data converter and the second low pass filter.

18. The error vector magnitude estimation circuitry of claim 16, wherein the comparison circuit further comprises:
a subtraction circuit configured to compute a difference between the first amplitude signal and the scaled version of the second amplitude signal.

19. The error vector magnitude estimation circuitry of claim 18, wherein the comparison circuit further comprises:
a first subcircuit configured to square the difference output from the subtraction circuit;
a second subcircuit configured to integrate signals output from the first subcircuit; and
a third subcircuit configured to double the signals output from the second subcircuit to generate the figure of merit.

* * * * *

UNITED STATES PATENT AND TRADEMARK OFFICE
CERTIFICATE OF CORRECTION

PATENT NO. : 12,149,382 B2  
APPLICATION NO. : 17/876916  
DATED : November 19, 2024  
INVENTOR(S) : Andrea Camuffo Page 1 of 1

It is certified that error appears in the above-identified patent and that said Letters Patent is hereby corrected as shown below:

In the Claims

Column 16, Lines 46-47, "energy measurement circuit" should read -- energy measurement circuits --

Column 17, Line 26, "claim 10, tuning" should read -- claim 10, wherein tuning --

Column 18, Line 10, "signal a second" should read -- signal, a second --

Signed and Sealed this  
Twenty-first Day of January, 2025

Coke Morgan Stewart  
*Acting Director of the United States Patent and Trademark Office*